(12) United States Patent
Li et al.

(10) Patent No.: US 12,354,918 B2
(45) Date of Patent: Jul. 8, 2025

(54) PACKAGE GEOMETRIES TO ENABLE VISUAL INSPECTION OF SOLDER FILLETS

(71) Applicant: TEXAS INSTRUMENTS INCORPORATED, Dallas, TX (US)

(72) Inventors: LongTing Li, ChengDu (CN); HuoYun Duan, ChengDu (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 262 days.

(21) Appl. No.: 17/491,405

(22) Filed: Sep. 30, 2021

(65) Prior Publication Data

US 2023/0098907 A1    Mar. 30, 2023

(51) Int. Cl.
*H01L 21/304*   (2006.01)
*H01L 21/66*    (2006.01)
(Continued)

(52) U.S. Cl.
CPC ............ *H01L 22/14* (2013.01); *H01L 21/304* (2013.01); *H01L 24/85* (2013.01); *H01L 24/96* (2013.01);
(Continued)

(58) Field of Classification Search
CPC ....... H01L 22/14; H01L 21/304; H01L 24/85; H01L 24/96; H01L 24/97;
(Continued)

(56) References Cited

U.S. PATENT DOCUMENTS 6,074,896 A * 6/2000 Dando ................. H01L 23/585
                                                         438/114
6,872,599 B1 * 3/2005 Li ....................... H01L 23/3107
                                                          438/15
(Continued)

OTHER PUBLICATIONS

Patricio Cabading Jr, et al., "Systematic Approach in Testing the Viability of Mechanical Partial-cut Singulation Process towards Tin-Plateable Sidewalls for Wettable Flank on Automotive QFN Technology". 2016 IEEE 18th Electronics Packaging Technology Conference (EPTC) (Year: 2016).*

*Primary Examiner* — Vu A Vu
(74) *Attorney, Agent, or Firm* — Xiaotun Qiu; Frank D. Cimino

(57) ABSTRACT

In examples, a method of manufacturing a semiconductor package comprises providing an array of unsingulated semiconductor packages, the array having a bottom surface and a conductive terminal exposed to the bottom surface, the conductive terminal including a slot configured to receive solder material. The method includes coupling a tape to the array of unsingulated semiconductor packages and applying a first saw blade to the bottom surface of the array to partially saw through a thickness of the array to a depth between two individual, adjacent, unsingulated semiconductor packages in the array of unsingulated semiconductor packages, the first saw blade producing a kerf. The method includes applying a second saw blade into the kerf to fully saw through the thickness of the array and produce a singulated semiconductor package, a width of the second (Continued)

saw blade narrower than the first saw blade. The conductive terminal is exposed to a side surface of the singulated semiconductor package, the side surface including a recessed area having a horizontal depth of no more than 30 microns.

23 Claims, 16 Drawing Sheets

(51) Int. Cl.
  *H01L 23/00* (2006.01)
  *H05K 3/34* (2006.01)
(52) U.S. Cl.
  CPC ........... *H01L 24/97* (2013.01); *H05K 3/3405* (2013.01); *H05K 3/3457* (2013.01); *H01L 2224/85801* (2013.01); *H01L 2224/85986* (2013.01); *H05K 2203/162* (2013.01)
(58) Field of Classification Search
  CPC ........... H01L 2224/85801; H01L 2224/85986; H05K 3/3405; H05K 3/3457; H05K 2203/16
  USPC ........................................................ 257/678
  See application file for complete search history.

(56) References Cited

U.S. PATENT DOCUMENTS

| | | | | |
|---|---|---|---|---|
| 8,728,933 | B1* | 5/2014 | Andres | H01L 31/18 |
| | | | | 438/668 |
| 8,994,160 | B2* | 3/2015 | Kimura | H01L 23/495 |
| | | | | 257/676 |
| 9,245,804 | B2* | 1/2016 | Zenz | H01L 21/782 |
| 9,502,272 | B2* | 11/2016 | Chen | H01L 24/19 |
| 9,899,349 | B2* | 2/2018 | Celaya | H01L 21/78 |
| 10,163,766 | B2* | 12/2018 | Truhitte | H01L 23/49541 |
| 10,199,311 | B2* | 2/2019 | Truhitte | H01L 23/49582 |
| 10,366,948 | B2* | 7/2019 | Kasuya | H01L 21/561 |
| 11,562,948 | B2* | 1/2023 | Lin | H01L 23/31 |
| 2010/0102341 | A1* | 4/2010 | Tsutsumi | H01L 33/22 |
| | | | | 438/33 |
| 2012/0126378 | A1* | 5/2012 | San Antonio | H01L 23/552 |
| | | | | 257/659 |
| 2013/0071970 | A1* | 3/2013 | Fujimoto | H01L 24/97 |
| | | | | 257/E21.599 |
| 2015/0262918 | A1* | 9/2015 | Tran | H01L 21/78 |
| | | | | 257/676 |
| 2018/0366396 | A1* | 12/2018 | Komatsu | H01L 22/12 |
| 2022/0163583 | A1* | 5/2022 | Hicks | G01R 31/311 |

* cited by examiner

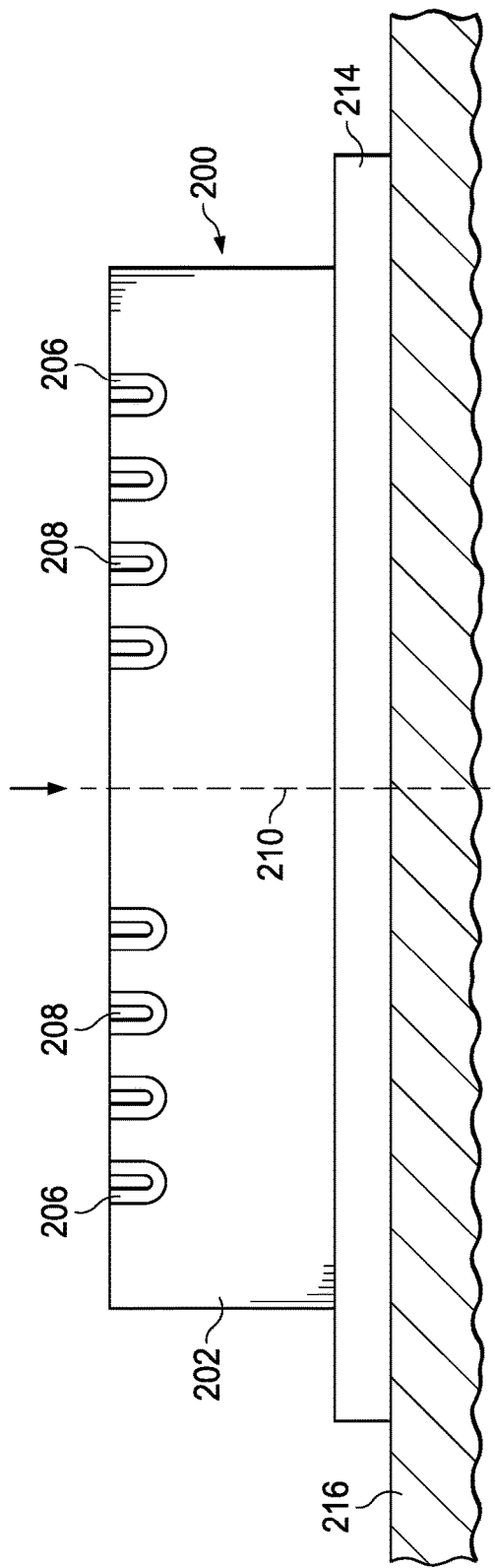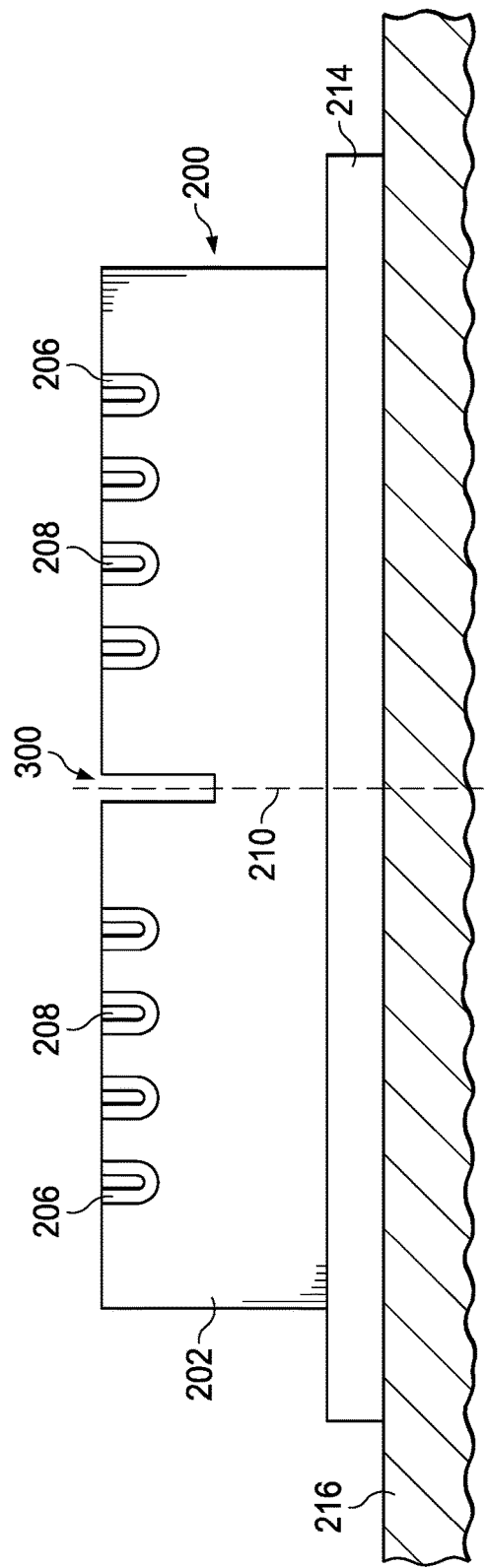

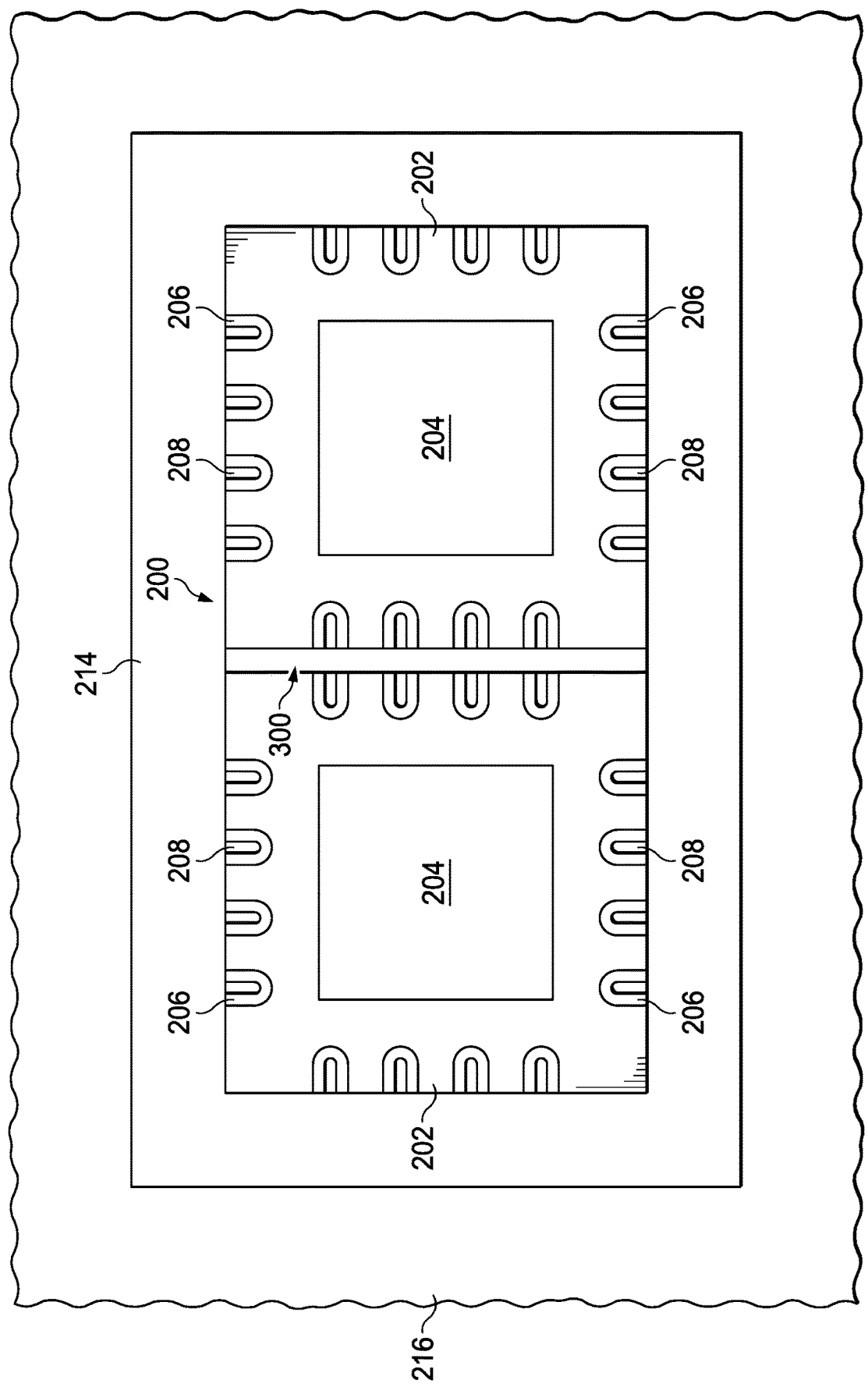
FIG. 3B2

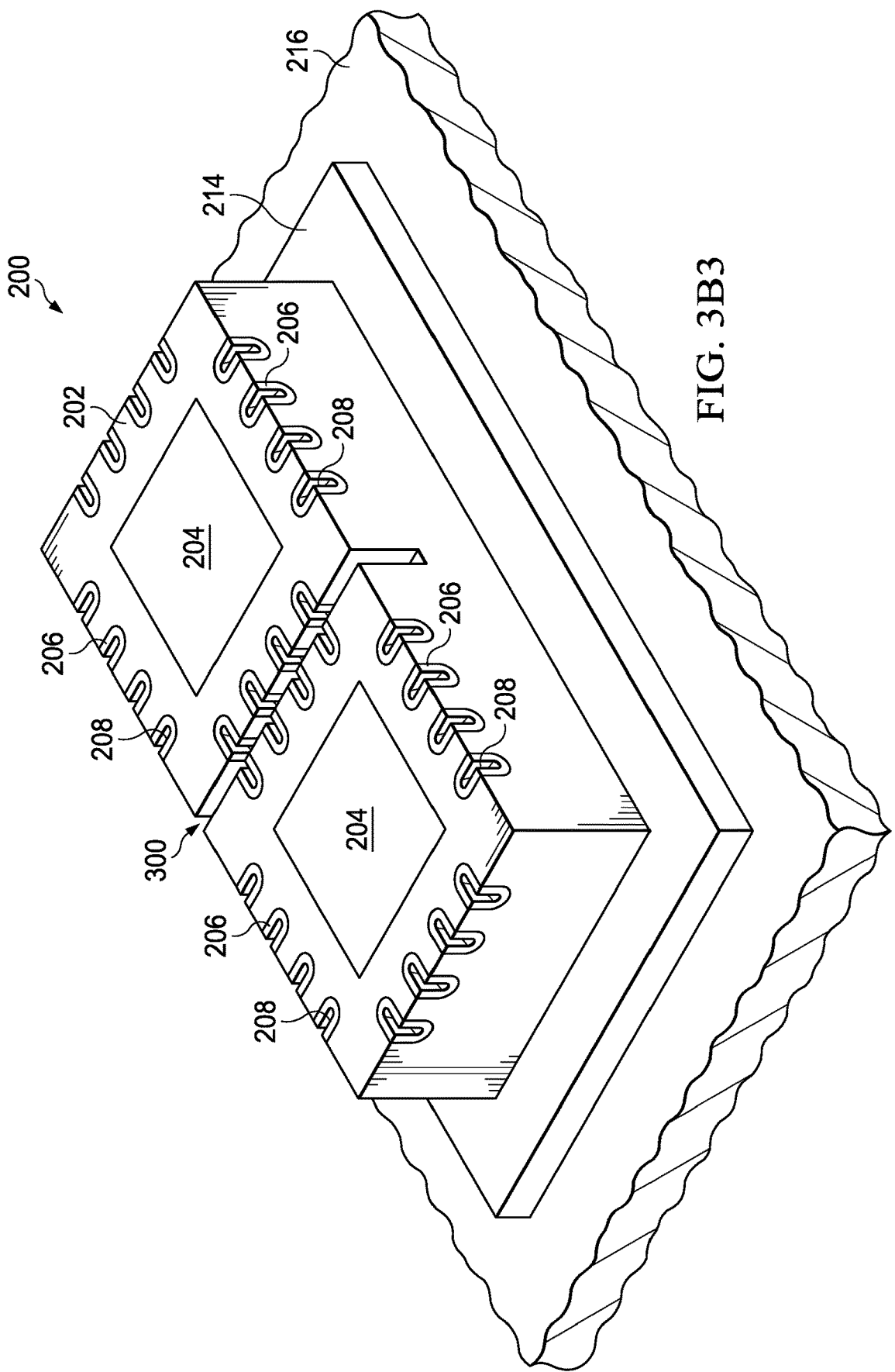
FIG. 3B3

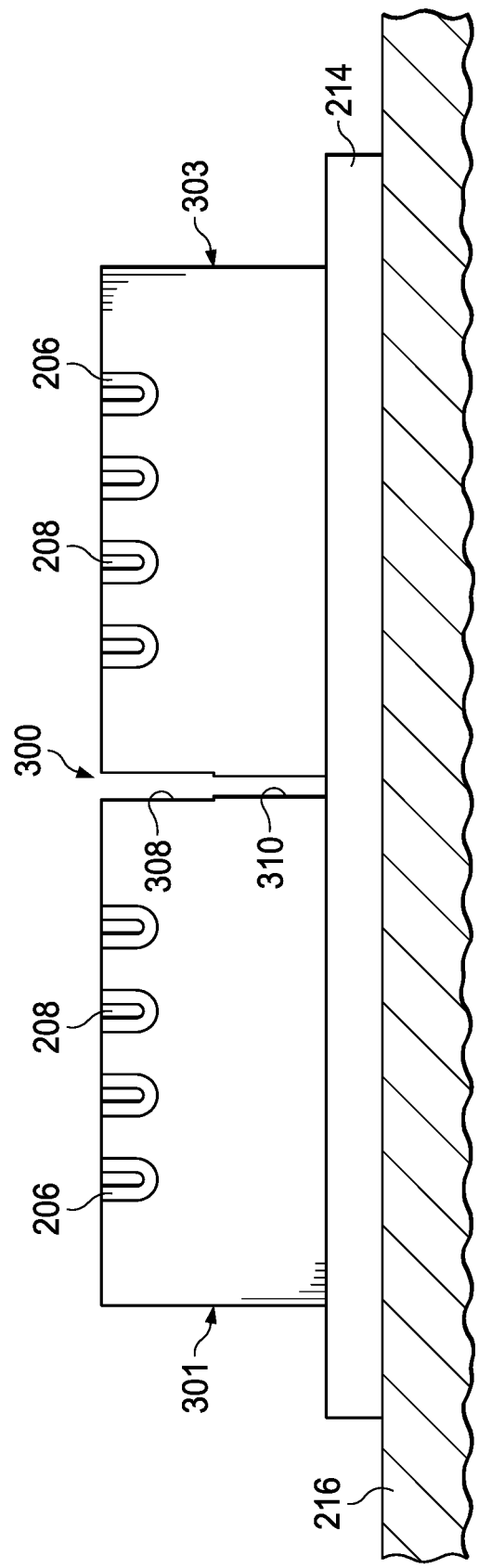
FIG. 3D1

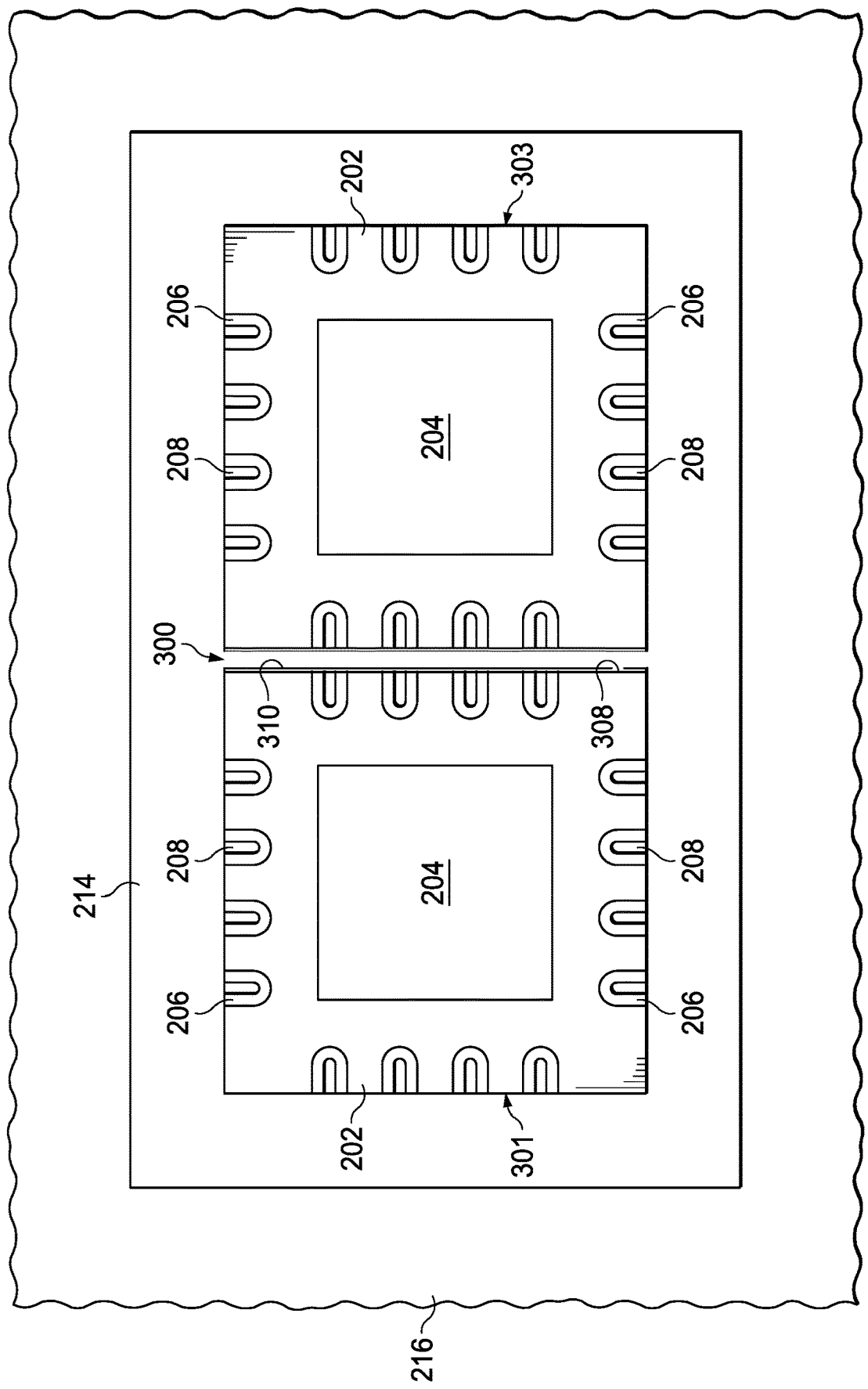
FIG. 3D2

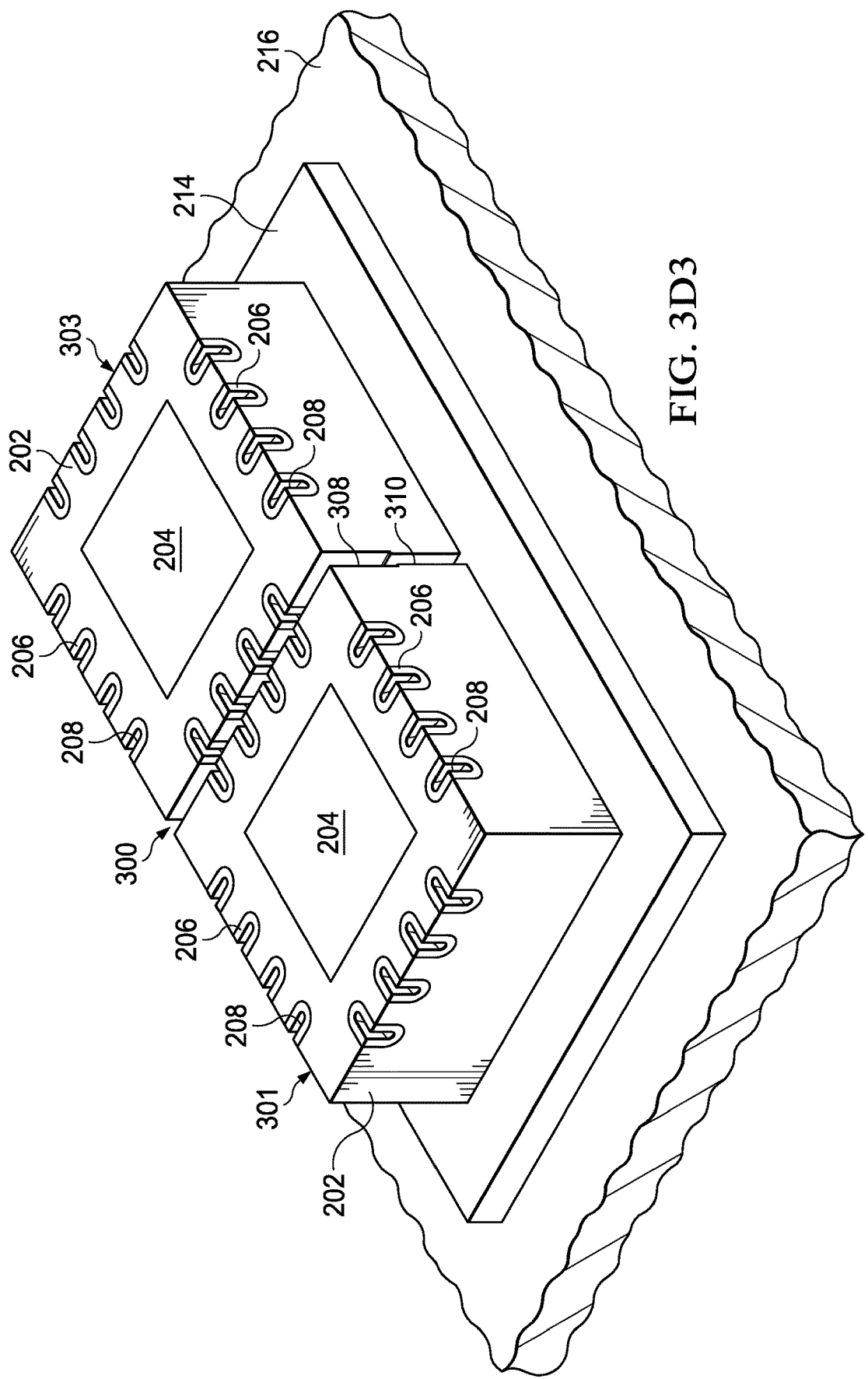
FIG. 3D3

PACKAGE GEOMETRIES TO ENABLE VISUAL INSPECTION OF SOLDER FILLETS

BACKGROUND

Semiconductor chips are often housed inside semiconductor packages that protect the chips from deleterious environmental influences, such as heat, moisture, and debris. A packaged chip communicates with electronic devices outside the package via conductive terminals, such as leads, that are exposed to surfaces of the package. Within the package, the chip may be electrically coupled to the conductive terminals using any suitable technique. One such technique is the flip-chip technique, in which the semiconductor chip (also called a "die") is flipped so the device side of the chip (in which circuitry is formed) is facing downward. The device side is coupled to the conductive terminals using, e.g., solder bumps. Another technique is the wire-bonding technique, in which the device side of the semiconductor chip is oriented upward and is coupled to the conductive terminals using bond wires.

SUMMARY

In examples, a method of manufacturing a semiconductor package comprises providing an array of unsingulated semiconductor packages, the array having a bottom surface and a conductive terminal exposed to the bottom surface, the conductive terminal including a slot configured to receive solder material. The method includes coupling a tape to the array of unsingulated semiconductor packages and applying a first saw blade to the bottom surface of the array to partially saw through a thickness of the array to a depth between two individual, adjacent, unsingulated semiconductor packages in the array of unsingulated semiconductor packages, the first saw blade producing a kerf. The method includes applying a second saw blade into the kerf to fully saw through the thickness of the array and produce a singulated semiconductor package, a width of the second saw blade narrower than the first saw blade. The conductive terminal is exposed to a side surface of the singulated semiconductor package, the side surface including a recessed area having a horizontal depth of no more than 30 microns.

BRIEF DESCRIPTION OF THE DRAWINGS

For a detailed description of various examples, reference will now be made to the accompanying drawings in which:

FIGS. 2A-2D and FIGS. 3A-3H are process flows for forming semiconductor package side surface geometries that facilitate the visual inspection of solder fillets, in accordance with various examples.

DETAILED DESCRIPTION

Figure 1:
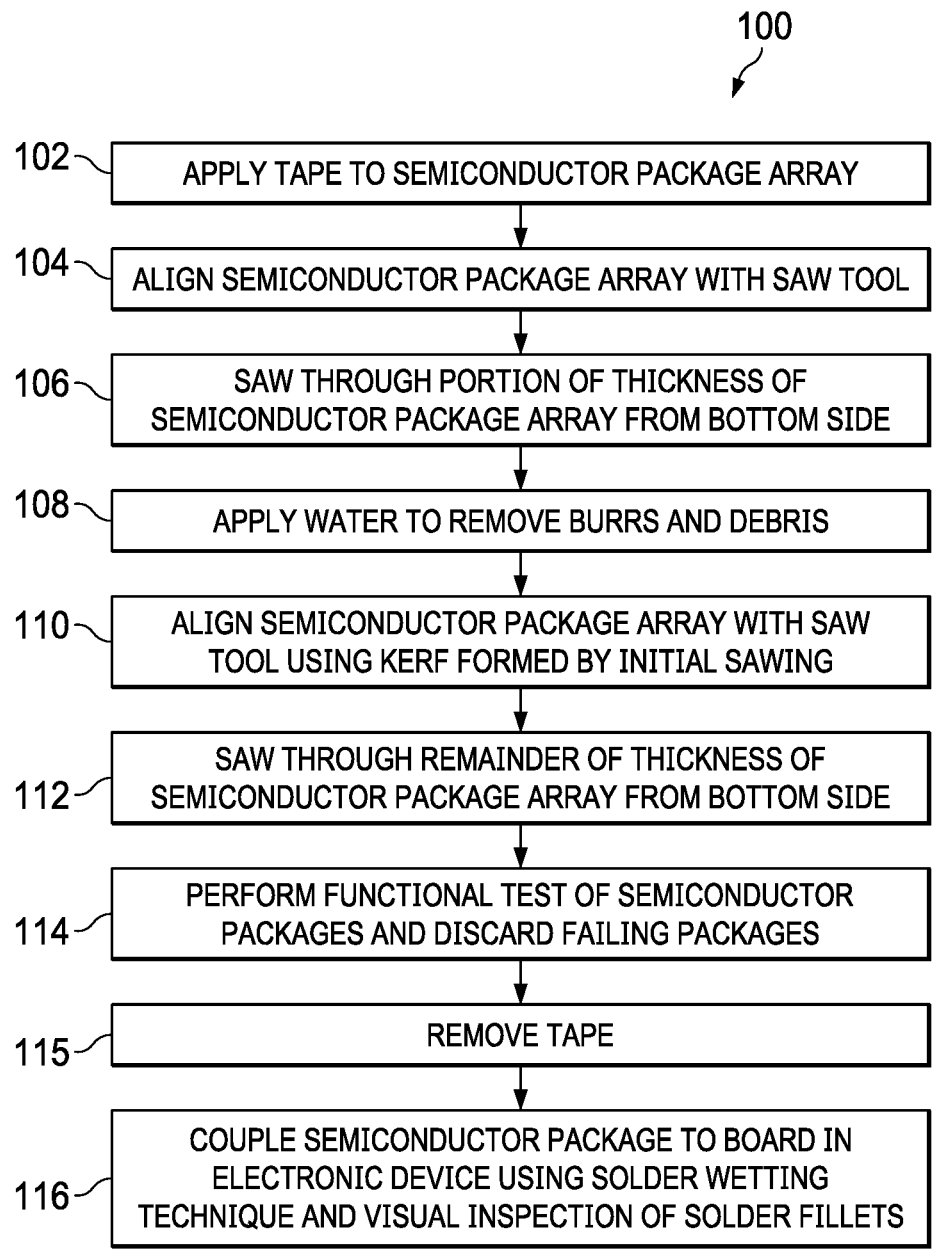
FIG. 1 is a flow diagram of a method for forming semiconductor package side surface geometries that facilitate the visual inspection of solder fillets, in accordance with various examples.

In some types of semiconductor packages (e.g., quad flat no lead (QFN) packages), conductive terminals are exposed to, and are approximately flush with, the bottom and/or side surfaces of the package. Such semiconductor packages may be soldered to a printed circuit board (PCB) or other suitable component of an electronic device during a solder wetting process. Specifically, solder is heated to cause a reflow in which the solder melts and flows to form a secure connection with both the conductive terminals and with the PCB. In some cases, it is desirable for the solder wetting process to form a fillet extending beyond the vertical planes of the outer perimeter of a semiconductor chip package so the quality of the soldered connection may be visually verified from above (e.g., manually or via automatic visual inspection (AVI) techniques). Such verification is particularly common and useful in the automotive industry, for example.

Proper visual inspection of solder fillets from a top-down view calls for semiconductor package side surfaces that are flat or almost flat. Certain geometries of semiconductor package side surfaces may preclude proper visual inspection of solder fillets from a top-down view. For example, if the upper half of a semiconductor package side surface extends farther away from a center of the package than does the lower half of the side surface, the upper half of the side surface forms an overhang and the solder fillets may not be visible from above. Thus, quality control measures such as visual inspection are precluded.

Semiconductor package side surface geometries that preclude visual inspection are frequently formed due to the combination of jigsaw blade force during singulation and inadequate vacuum suction to hold the package stationary during singulation. These factors together cause movement of the semiconductor package during singulation, which results in an irregular semiconductor package side surface geometry. This irregular semiconductor package side surface geometry is often shaped in a way that precludes proper visual inspection of solder fillets, as described above. Furthermore, in conventional manufacturing processes, functional testing of the semiconductor packages is performed before the singulation process is fully complete, meaning that any sawing action performed after such functional testing may cause damage that negatively impacts package functionality but is not detected. Thus, defective packages are shipped to customers, diminishing both manufacturing yield and customer satisfaction.

This disclosure describes a semiconductor package singulation technique that mitigates the formation of aberrant semiconductor package side surface geometries that prevent the proper visual inspection of solder fillets. The singulation technique is applied to an array of semiconductor packages after removal from a mold chase in which mold compound is applied to an array of semiconductor dies and die pads, conductive terminals, bond wires, etc. that may be coupled to the semiconductor dies. The singulation technique is applied to the array of semiconductor packages to produce individual semiconductor packages that reliably have side surface geometries that facilitate visual inspection of solder fillets.

The singulation technique described herein entails a two-part sawing process. First, the singulation technique includes applying a tape to a top side of the array of semiconductor packages and sawing a bottom side of the array of semiconductor packages. Sawing the bottom side of the array of semiconductor packages includes sawing through some, but not all, of the thickness of the array of semiconductor packages. The singulation technique includes using water or another appropriate liquid (e.g., a solution) to remove burrs and debris that form from the first sawing instance. The singulation technique includes performing a second sawing instance in which a blade narrower than that used in the first sawing instance is used to saw through the remainder of the thickness of the array of semiconductor packages. Like the first sawing instance, the second sawing instance is performed on the bottom side of the array of semiconductor packages, and more specifically into a kerf that was formed by the first sawing instance. Singulation is then complete. A functional test of the semiconductor packages is performed after singulation is complete, thereby mitigating the risk of damage, diminished yield, and customer dissatisfaction caused by post-testing singulation. The packages may then be processed, packaged, and shipped to a customer.

When a semiconductor package singulated in accordance with examples described herein is coupled to a PCB using a solder wetting technique, the solder fillets will be easily visible from a top-down view, because the side surfaces of the semiconductor package do not have geometries that significantly obstruct the view of the solder fillets.

Figure 3C:
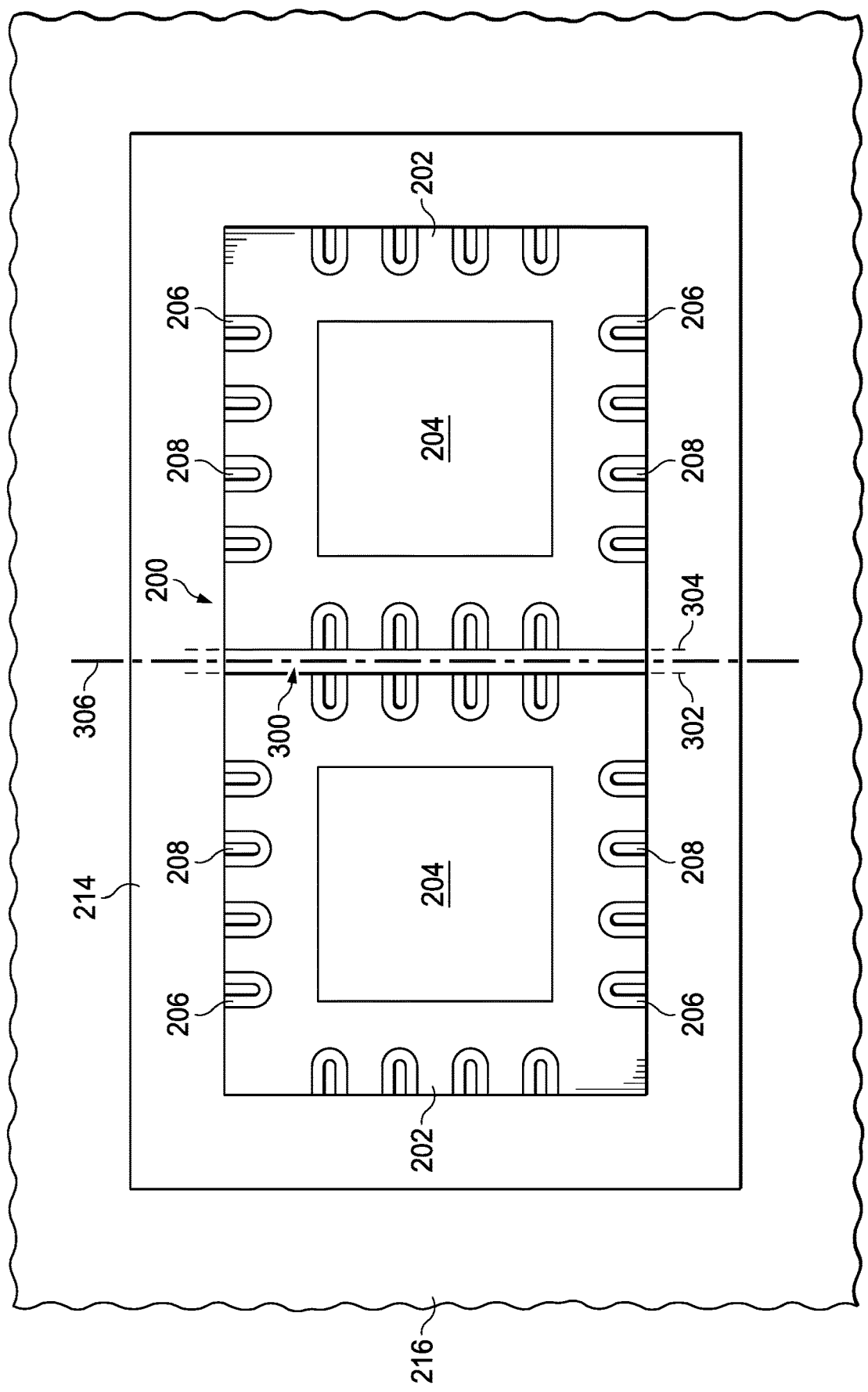
Figure 3E:
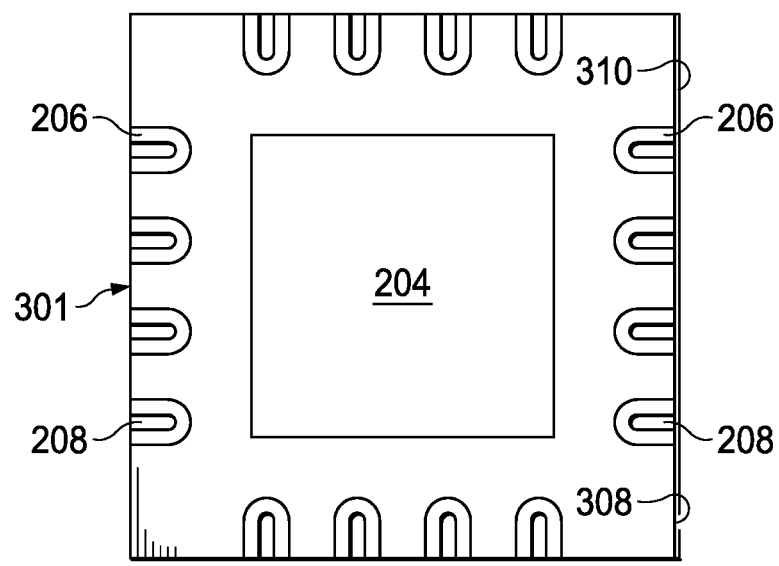
Figure 3F:
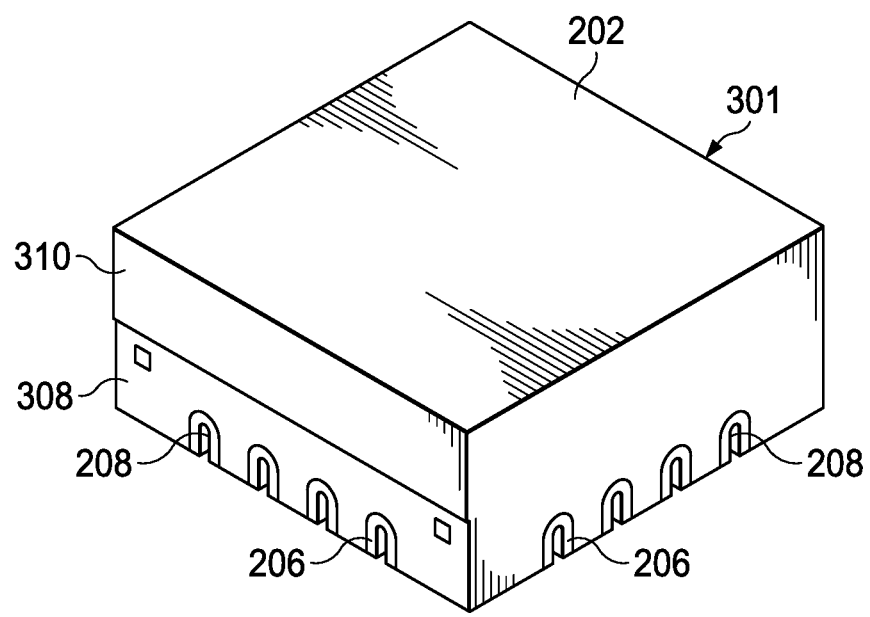
Figure 3G:
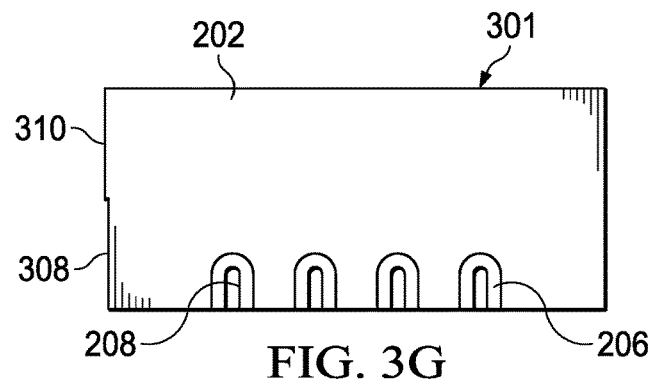
Figure 3H:
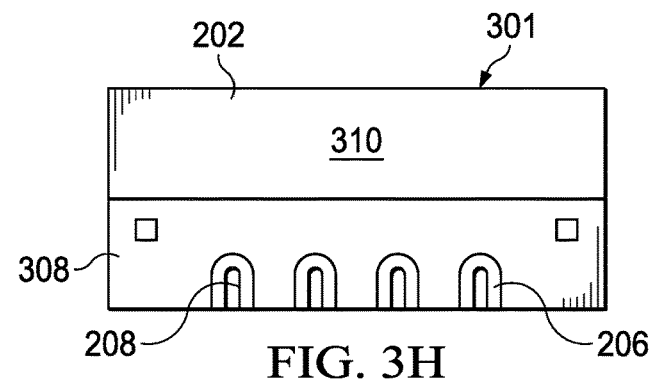
Figure 4B:
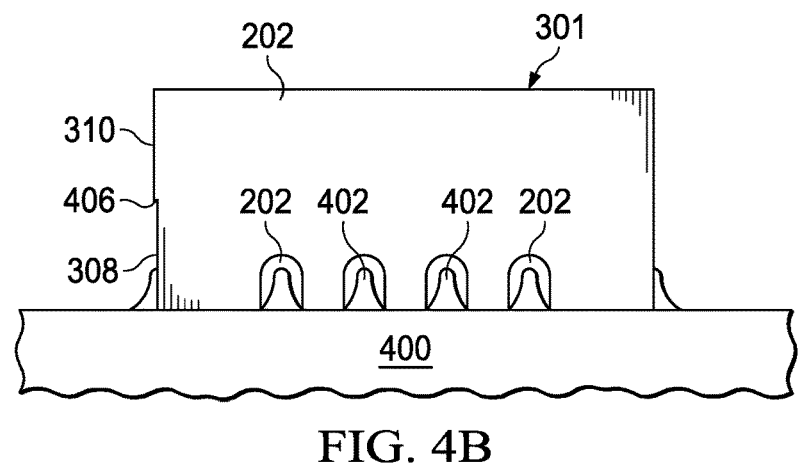
FIGS. 4A-4C are perspective, profile, and top-down views of a semiconductor package coupled to a printed circuit board and having a side surface geometry that facilitates the visual inspection of solder fillets, in accordance with various examples.
Figure 4A:
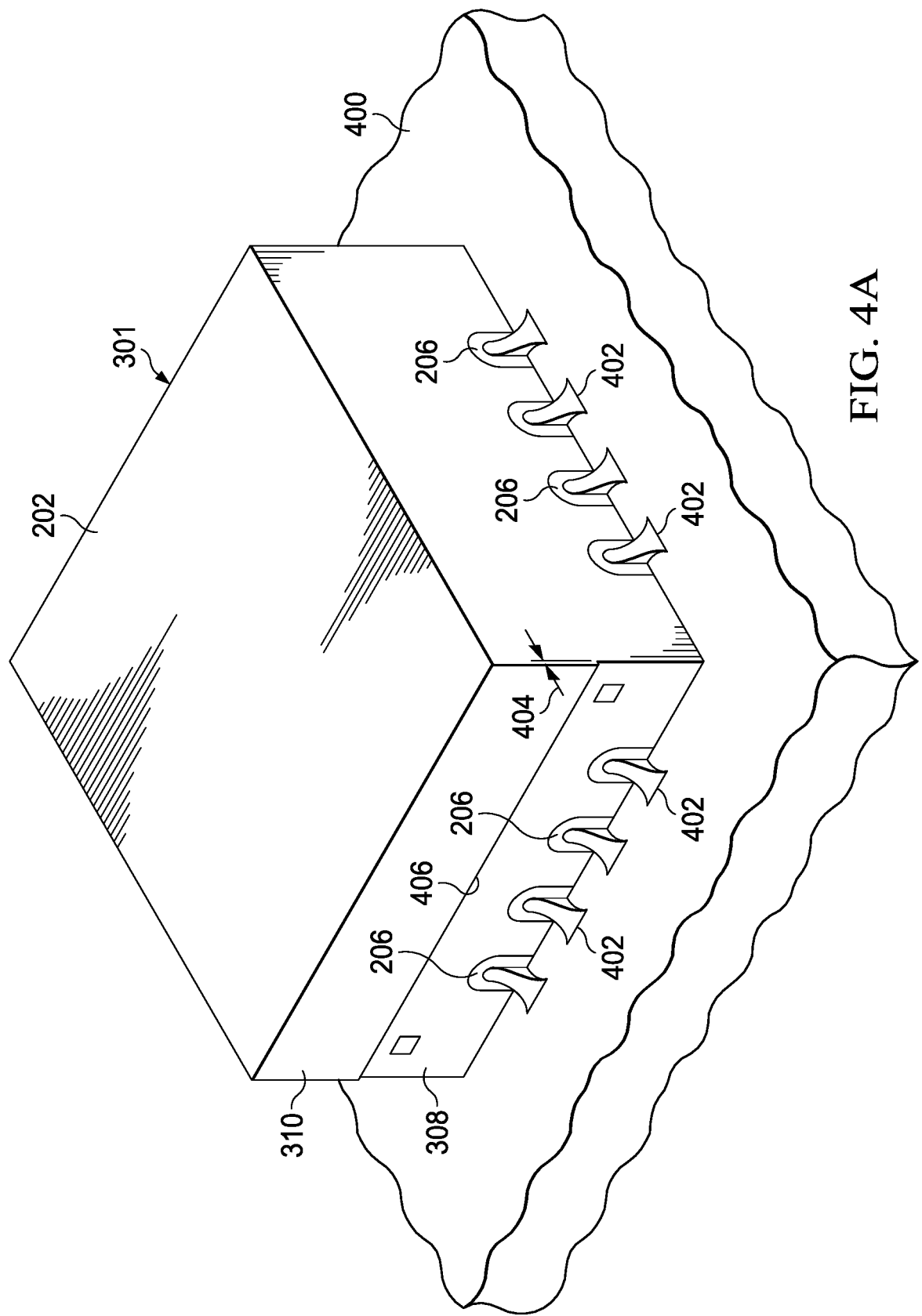
Figure 4C:
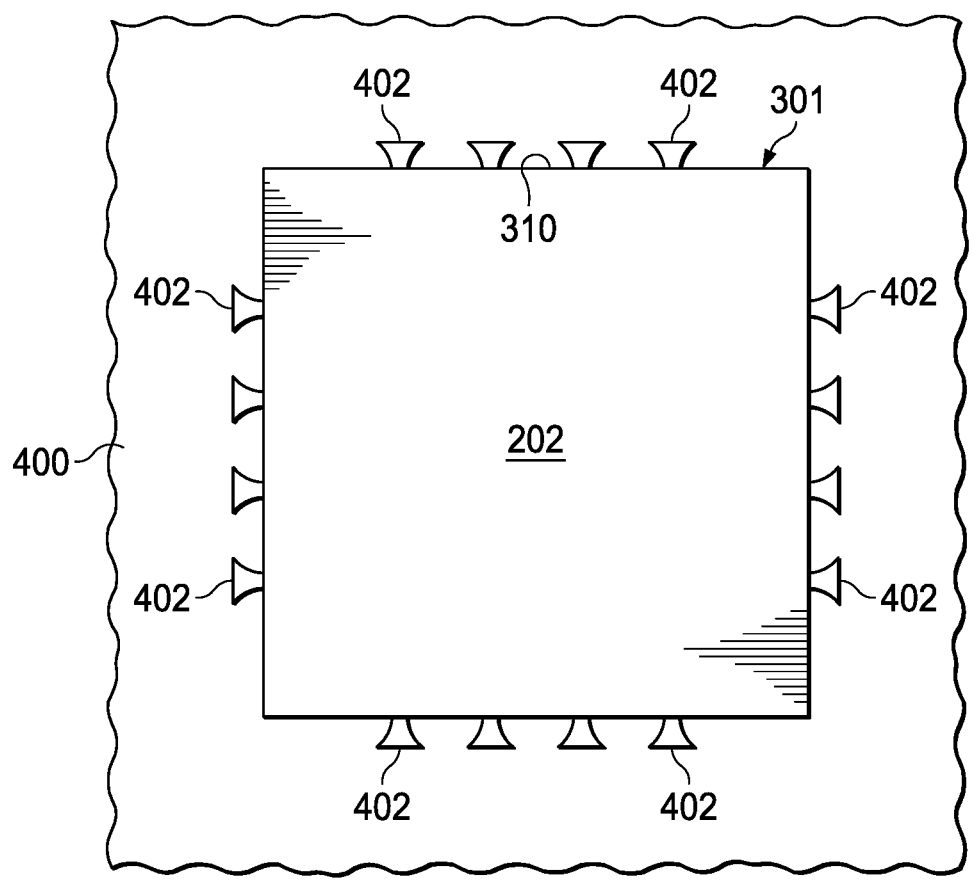

Example semiconductor package singulation techniques are now described with reference to the drawings. FIG. 1 is a flow diagram of a method 100 for forming semiconductor package side surface geometries that facilitate the visual inspection of solder fillets, in accordance with various examples. FIGS. 2A-2D and FIGS. 3A-3H are process flows for forming semiconductor package side surface geometries that facilitate the visual inspection of solder fillets, in accordance with various examples. FIGS. 4A-4C are perspective, profile, and top-down views of a semiconductor package coupled to a PCB and having a side surface geometry that facilitates the visual inspection of solder fillets, in accordance with various examples. Accordingly, FIGS. 1, 2A-2D, 3A-3H, and 4A-4C are now described in parallel.

The method 100 is applied to an array of unsingulated semiconductor packages. Thus, an example unsingulated semiconductor package array is first described with reference to FIGS. 2A-2D, followed by a description of the method 100 as applied to the example array. In an example unsingulated semiconductor package array, a set of semiconductor dies may be coupled to a lead frame strip, and appropriate wirebond connections, solder ball connections, etc. may be established between the semiconductor dies and their respective lead frames in the lead frame strip. The resulting assembly may then be positioned inside a mold chase. After a top member of the mold chase is closed, mold compound may be injected into the mold chase, thus covering the assembly of semiconductor dies on the lead frame strip with mold compound. The mold compound may be cured. The resulting structure is an array of unsingulated semiconductor packages that are coupled to each other by mold compound, tie bars, and dam bars.

Figure 2A:
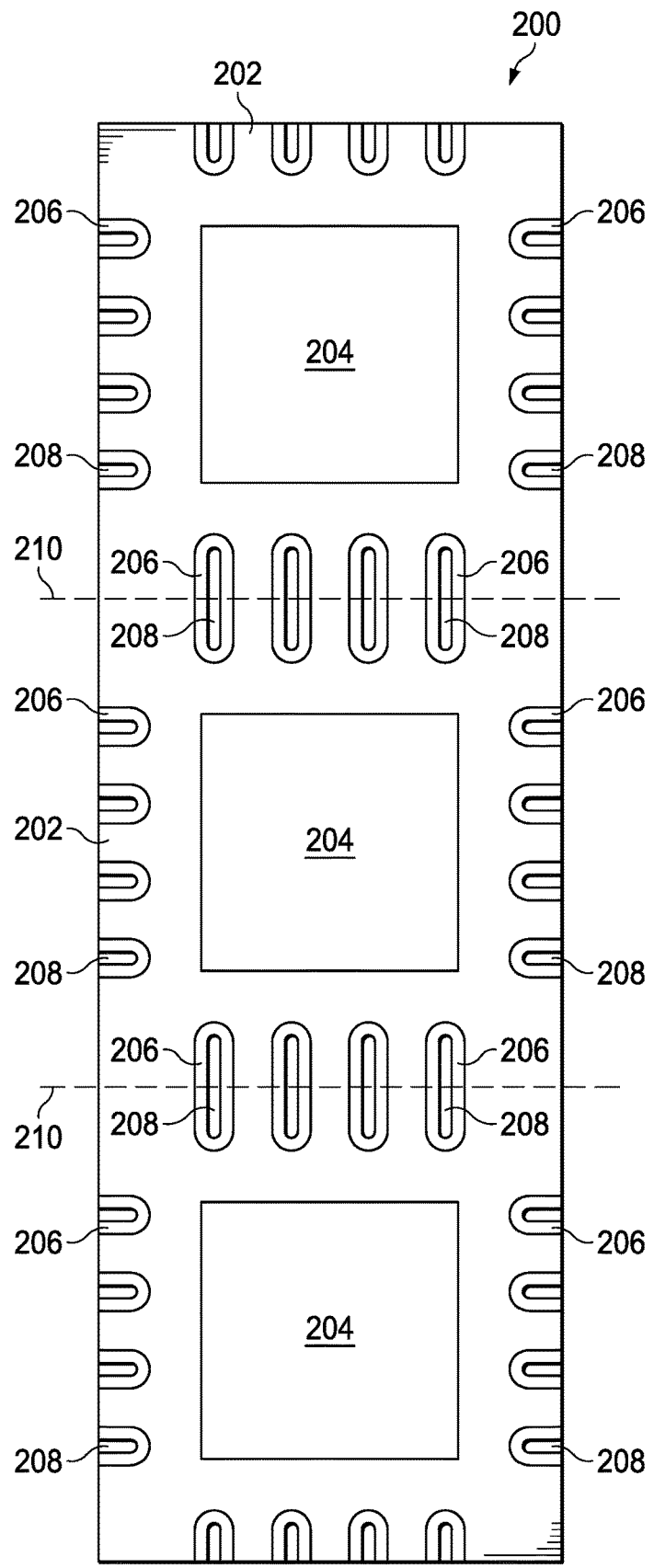
Figure 2B:
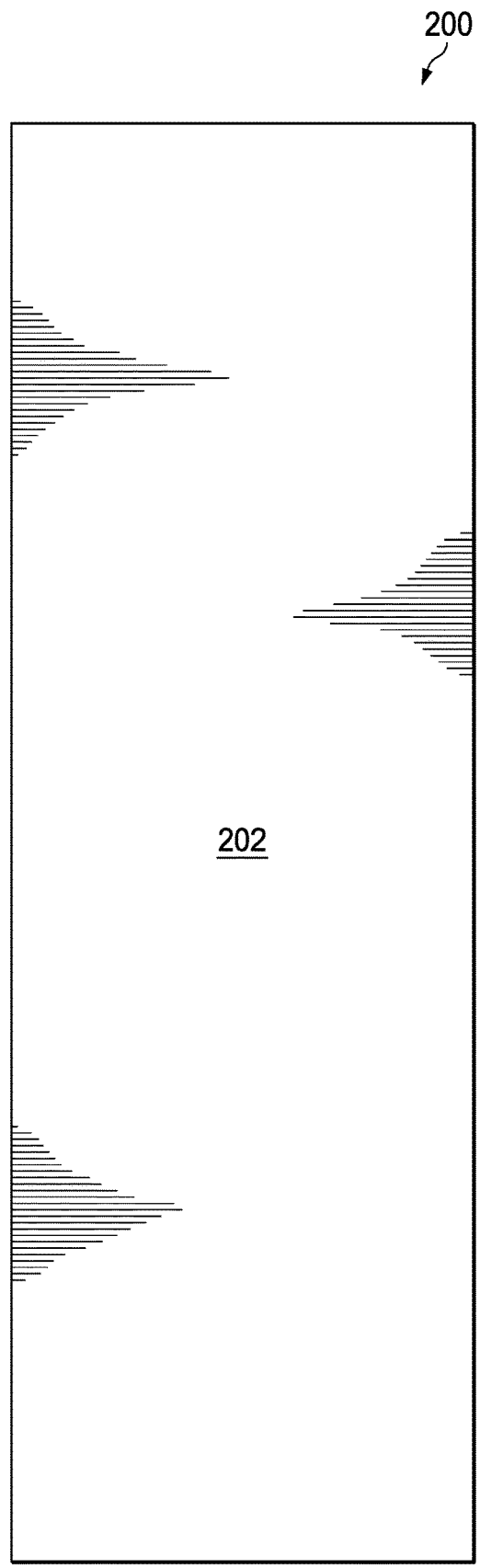
Figure 2C:
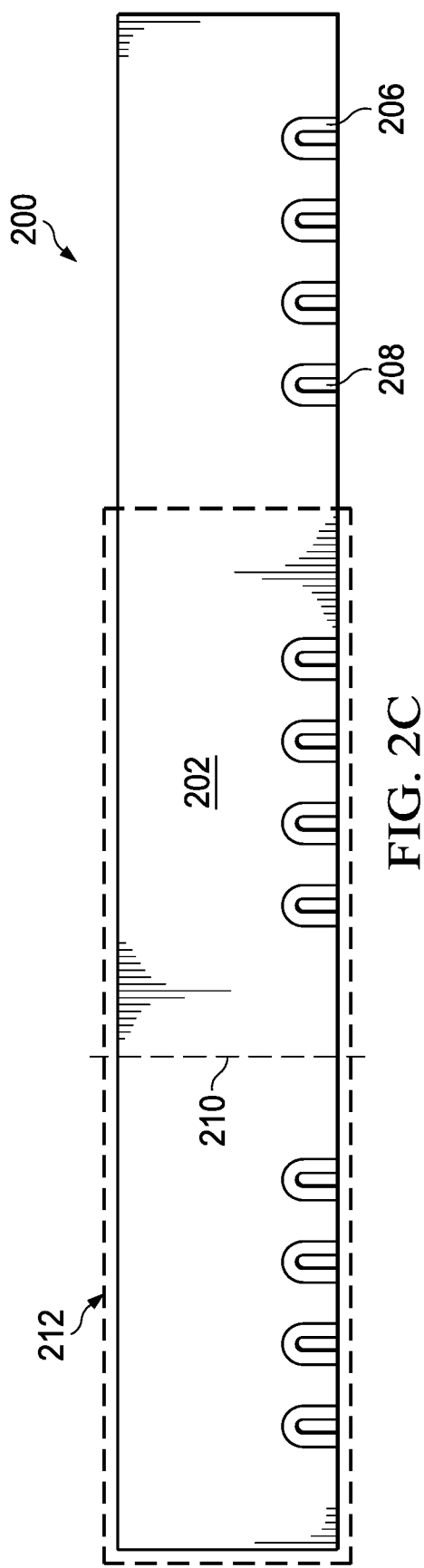
Figure 2D:
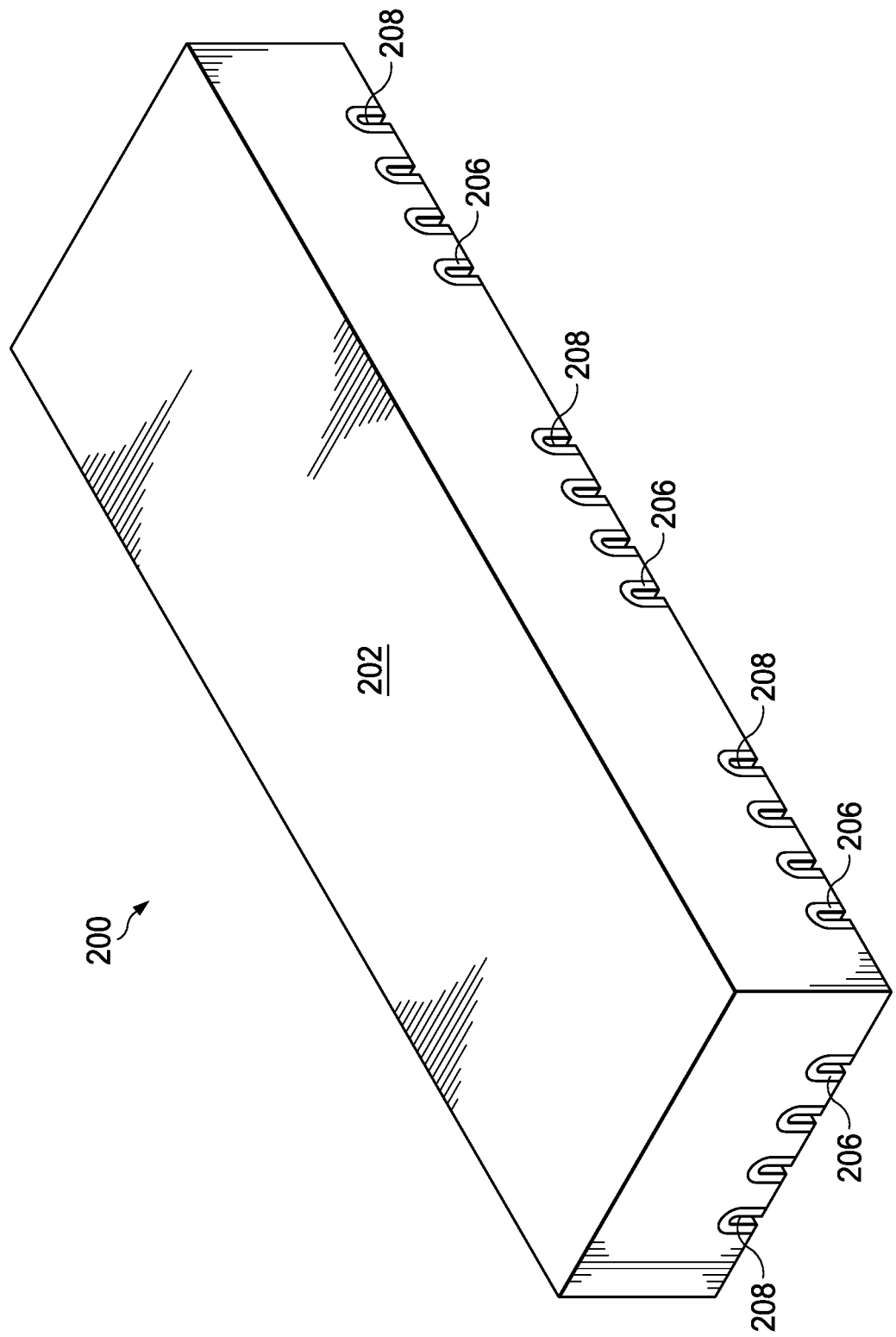

FIG. 2A is a bottom-up view of an example unsingulated semiconductor package array 200, and FIG. 2B is a top-down view of the array 200. The bottom surface shown in FIG. 2A includes a mold compound 202, die pads 204 that are exposed to the bottom surface of the array 200, and conductive terminals 206 that are exposed to the bottom surface of the array 200. A bottom surface of an array of unsingulated semiconductor packages, as used herein, is the surface of the array of unsingulated semiconductor packages to which die pads and conductive terminals are exposed. The conductive terminals 206 include slots 208 configured to receive solder material, for example, during a solder wetting process. A dashed line 210 indicates an example location where the sawing processes of method 100 may be performed, as described in greater detail below. Similar sawing processes may be applied in other areas of the array 200. FIG. 2B depicts the top surface of the array 200, including the mold compound 202, where the tape of step 102 may be applied. FIG. 2C is a profile view of the array 200. The conductive terminals 206 and the slots 208 on the bottom surface (FIG. 2A) extend to the side surfaces of the array 200, as FIG. 2C shows. Numeral 212 indicates a representative portion of the array 200 that is used to describe the sawing processes of FIG. 1 below. FIG. 2D is a perspective view of the structure of FIGS. 2A-2C.

In step 102 of method 100, a tape, such as an ultraviolet (UV) tape, is applied to a top surface of the array 200, such as the top surface of the array 200 shown in FIG. 2C. FIG. 3A is a profile view of the array 200 coupled to a tape 214. The array 200 and the tape 214 may be positioned on a carrier, frame, or other suitable surface 216. In examples, the tape 214 has an adhesiveness ranging from 5.5 Newtons (N)/25 millimeters (mm) to 5.9 N/25 mm, with an adhesiveness less than this range being disadvantageous because it would result in movement of the structure during subsequent sawing, causing chipping and other structural defects, and with an adhesiveness greater than this range being disadvantageous because it can result in tape residue on packages that reduce manufacturing yield. In this way, the array 200 is held stationary during sawing processes. In step 104 of the method 100, the array 200 is aligned with a saw tool. In examples, the saw tool includes a saw blade useful to saw through some or all of the thickness of the array 200.

In step 106, the method 100 includes sawing through some, but not all, of the thickness of the array 200 from the bottom surface of the array 200 (e.g., the surface shown in FIG. 2A). FIG. 3B1 is a profile view of the array 200 after the sawing process of step 106 is complete. The array 200 includes a kerf 300 sawn along dashed line 210. A kerf, as used herein, is an opening formed in a material by sawing. In examples, the saw blade used to form the kerf 300 is a resin blade with an outlier diameter of 59 mm, a width of 0.27 mm, and a blade inner diameter of 40 mm. In examples, the saw blade is not a jigsaw blade because of the undesirable degree of force applied by the jigsaw blade and the resulting aberrant side surface geometries as described above. In examples, the saw blade has a width ranging from 0.26 mm to 0.28 mm, with a width below this range being disadvantageous because it can result in structural defects (e.g., burrs) during subsequent sawing, and with a width above this range being disadvantageous because it will result in an unacceptably large overhang unsuitable for quality control viewing (e.g., automatic visual inspection), for example, exceeding 30 microns. FIG. 3B2 is a top-down view of the array 200 having the kerf 300, and FIG. 3B3 is a perspective view of the array 200 having the kerf 300. The depth of the kerf 300 after the sawing of step 106 ranges from 50 percent of the thickness of the array 200 to 60 percent of the thickness of the array 200, with a depth greater than this range being disadvantageous because the remaining thickness of the array 200 would not be able to withstand the application of pressurized fluid for burr removal, and with a depth less than this range being disadvantageous because it would result in the formation of undesirable structural features during a second sawing that would preclude adequate visual inspection for quality control measures.

In step 108, the method 100 includes applying a liquid to the array 200 to remove burrs and debris. In some examples, water may be applied. In some examples, deionized water may be applied at very high pressure in the range of 60 mega pascals (MPa) to 80 MPa. Other appropriate liquids or solutions may be used, and in some examples, other techniques (e.g., vacuum techniques) may be useful to remove burrs and debris.

In step 110, the method 100 includes re-aligning the array 200 with the saw tool using the kerf 300. FIG. 3C is a top-down view of the structure of FIGS. 3B1-3B3. An example saw tool may include peripheral alignment lines 302, 304 and a central alignment line 306, for example on a display panel, a viewer, a lens, etc. The edges of the kerf 300 (e.g., the edges of the bottom surface of array 200 abutting the kerf 300) may be aligned with the peripheral alignment lines 302, 304, as shown in FIG. 3C. The central alignment line 306 may be aligned with the kerf 300 (e.g., the gap between the edges of the kerf 300), as shown. This re-alignment in step 110 promotes a more accurate sawing process in step 112, in which the saw tool is used to apply a different saw blade than that used in step 106 into the kerf 300 via the bottom surface of the array 200 to fully saw through the array 200. In examples, the saw blade used in step 112 is narrower than the saw blade used in step 106. In examples, the width of the saw blade used in step 112 has a range from 0.255 mm to 0.265 mm, with a blade width above this range being disadvantageous because it will cause the formation of undesirable structural features such as burrs, and with a blade width below this range being disadvantageous because it will result in other undesirable structural features, such as undesirably large overhangs exceeding 30 microns that preclude adequate visual inspection for quality control purposes. In examples, the difference in width between the saw blade used in step 106 and the saw blade used in step 112 (with the saw blade used in step 112 being narrower) is within a range from 0 microns to 25 microns, with a difference smaller than this range being disadvantageous because it will result in the formation of undesirable structural features such as burrs, and with a difference greater than this range being disadvantageous because it will result in other undesirable structural features, such as undesirably large overhangs exceeding 30 microns. In examples, the saw blade used in step 112 is a resin blade. In examples, the saw blade used in step 112 is not a jigsaw blade because of the undesirable degree of force applied by the jigsaw blade and the resulting aberrant side surface geometries as described above.

FIG. 3D1 is a profile view depicting the array 200 after complete singulation in step 112. As shown, the kerf 300 extends through the entire thickness of the formerly unsingulated array 200, thus producing a singulated semiconductor package 301 and a singulated semiconductor package 303. A side surface geometry of the singulated semiconductor package 301 includes a recessed area 308 and a non-recessed area 310. The horizontal depth of the recessed area 308 relative to the non-recessed area 310 is no more than 30 microns. This horizontal depth may be controlled by the difference in saw widths used in steps 106 and 112. A larger difference in saw widths used in steps 106 and 112 results in a greater horizontal depth of the recessed area 308, while a smaller difference in saw widths used in steps 106 and 112 results in a lesser horizontal depth of the recessed area 308. FIG. 3D2 is a top-down view of the structure of FIG. 3D1, and FIG. 3D3 is a perspective view of the structure of FIG. 3D1. FIG. 3E is a bottom-up view of the singulated semiconductor package 301. FIG. 3F is a perspective view of the singulated semiconductor package 301. FIG. 3G is a profile view of the singulated semiconductor package 301, and FIG. 3H is another profile view of the singulated semiconductor package 301.

In step 114, the method 100 includes performing a functional test of the singulated semiconductor package 301 and discarding any failing packages. For example, the functional test may include applying specific signals to specific conductive terminals 206 of the singulated semiconductor package 301 and measuring output signals provided on other conductive terminals 206 of the singulated semiconductor package 301 to determine whether a defect is present in bond wires, bond pads, or the semiconductor die within the singulated semiconductor package 301. A failing package 301 may be discarded or repaired. Tape may be removed in step 115.

In step 116, the method 100 includes coupling the singulated semiconductor package 301 to a PCB to be included in an electronic device using a solder wetting technique and performing a visual inspection (e.g., AVI) of the resulting solder fillets. FIG. 4A is a perspective view of the singulated semiconductor package 301 coupled to a PCB 400. Solder fillets 402 couple conductive terminals 206 to the PCB 400 (e.g., to bond pads on the PCB 400). The solder fillets 402 are formed in part when solder material rises to fill the slots 208. The recessed area 308 is offset from the non-recessed area 310 by a horizontal depth 404 that does not exceed 30 microns. Because the horizontal depth 404 does not exceed 30 microns, the solder fillets 402 are adequately visible from a top-down view to perform visual inspections (e.g., AVI). In addition, a step 406 at an interface between the recessed area 308 and the non-recessed area 310 is substantially flat and is substantially parallel to the top and bottom surfaces of the singulated semiconductor package 301, as shown in FIG. 4A. FIG. 4B is a profile view of the structure of FIG. 4A, and FIG. 4C is a top-down view of the structure of FIG. 4A.

Experimental data supports the efficacy of the techniques described herein, including the critical parameter ranges described herein, in consistently producing horizontal depths 404 that are below 30 microns. In an experiment involving horizontal depth measurements across a variety of package sizes, the average maximum horizontal depth measurement of recessed areas measured 17.46 microns. No recessed area depth measurement exceeded 21.3 microns. All but one of the packages tested produced maximum recessed area depth measurements less than 20 microns. The average recessed area depth measurement across all packages tested did not exceed 6.48 microns. The average depth measurement for each tested package, when ordered, produced a median of 5.79 microns. The smallest process capability index (CPK) value calculated for any package tested was 1.78, indicating excellent ability to meet recessed area depth specifications, and the largest CPK value calculated for any package tested was 2.49, indicating superior ability to meet recessed area depth specifications. Thus, this experimental data establishes the efficacy of the techniques described herein, including the critical parameter ranges described herein, in producing singulated semiconductor packages having sufficiently small side surface recessed area depth measurements to permit AVI of conductive terminal solder fillets.

Figure 5:
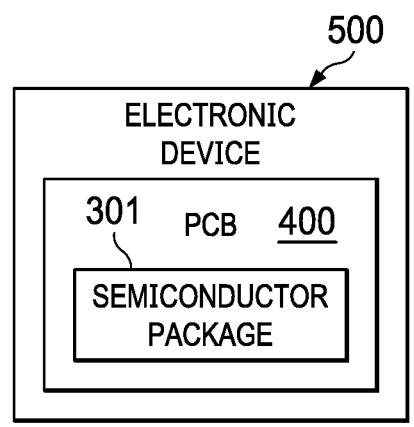
FIG. 5 is a block diagram of an electronic device including a semiconductor package having a side surface geometry that facilitates the visual inspection of solder fillets, in accordance with various examples.

FIG. 5 is a block diagram of an electronic device 500 including a semiconductor package having a side surface geometry that facilitates the visual inspection of solder fillets, in accordance with various examples. For example, the electronic device 500 may be a laptop, desktop, or notebook computer, a smartphone, an appliance, a vehicle, etc. The electronic device 500 includes a PCB 400 and the singulated semiconductor package 301 coupled to the PCB 400. The singulated semiconductor package 301 has the side surface geometries described above and, thus, when it is coupled to the PCB 400, visual inspection techniques (e.g., AVI) are possible to ensure that proper solder fillets are formed.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A. Unless otherwise stated, "about," "approximately," or "substantially" preceding a value means+/−10 percent of the stated value. Modifications are possible in the described examples, and other examples are possible within the scope of the claims.

What is claimed is:

1. A method of manufacturing a semiconductor package, comprising:
   providing an array of unsingulated semiconductor packages, that are molded using a mold compound, the array having a bottom surface and a conductive terminal exposed to the bottom surface, the conductive terminal including a slot configured to receive solder material;
   coupling a tape to the array;
   applying a first saw blade to the bottom surface of the array to partially saw through a first thickness of the array between two individual, adjacent, unsingulated semiconductor packages, the first saw blade producing a kerf; and
   applying a second saw blade into the kerf to fully saw through a remaining thickness of the array and produce a singulated semiconductor package, a width of the second saw blade narrower than a width of the first saw blade,
   wherein the conductive terminal is exposed to a side surface of the singulated semiconductor package, and the first thickness is greater than the remaining thickness.

2. The method of claim 1, wherein the side surface of the singulated semiconductor package includes a recessed area and a non-recessed area, and wherein the recessed area is more distal to a top surface of the singulated semiconductor package than the non-recessed area.

3. The method of claim 1, further comprising performing a first alignment of a saw tool prior to applying the first saw blade.

4. The method of claim 3, further comprising performing a second alignment of the saw tool after applying the first saw blade and prior to applying the second saw blade.

5. The method of claim 4, wherein performing the second alignment comprises aligning the saw tool with the kerf.

6. The method of claim 1, further comprising performing a functional test of the singulated semiconductor package.

7. The method of claim 1, further comprising:
   coupling the singulated semiconductor package to a printed circuit board using a solder wetting technique; and
   using an automatic visual inspection (AVI) technique to inspect a solder fillet formed by the solder wetting technique.

8. The method of claim 1, wherein the singulated semiconductor package is a quad flat no lead (QFN) package.

9. The method of claim 1, wherein the first and second saw blades are not jigsaw blades.

10. The method of claim 1, further comprising:
    prior to providing the array of unsingulated semiconductor packages, wirebonding a plurality of semiconductor dies to a set of conductive terminals including the conductive terminal exposed to the bottom surface; and
    prior to providing the array of unsingulated semiconductor packages, applying a mold compound to cover the plurality of semiconductor dies.

11. A method of manufacturing a semiconductor package, comprising:
    applying a tape to a top surface of an array of unsingulated quad flat no lead (QFN) semiconductor packages that are molded using a mold compound;
    applying a first saw blade to a bottom surface of the array to form a kerf in the bottom surface, the bottom surface having a conductive terminal, the kerf extending to a first thickness of the array between two individual, adjacent, unsingulated QFN semiconductor packages;
    aligning a saw tool having a second saw blade to the kerf, a width of the second saw blade narrower than a width of the first saw blade, wherein the second saw blade is a resin blade; and
    applying the second saw blade into the kerf to fully saw through a remaining thickness of the array to singulate the array and produce a singulated semiconductor package having a side surface, the side surface having a recessed area and a non-recessed area, wherein the first thickness is greater than the remaining thickness.

12. The method of claim 11, wherein the recessed area is no more than 60 microns wider relative to the non-recessed area.

13. The method of claim 11, wherein a step at an interface of the recessed and non-recessed areas is substantially flat and is substantially parallel with a top surface of the singulated semiconductor package.

14. The method of claim 11, further comprising performing a functional test of the singulated semiconductor package.

15. The method of claim 11, wherein the recessed area is more proximal to the conductive terminal than the non-recessed area, the conductive terminal on a bottom surface of the singulated semiconductor package.

16. The method of claim 11, wherein the first and second saw blades are not jigsaw blades.

17. The method of claim 11, further comprising using a liquid to remove burrs from the kerf between applications of the first and second saw blades.

18. The method of claim 11, further comprising forming the array of unsingulated QFN semiconductor packages by wirebonding a plurality of semiconductor dies to a plurality of conductive terminals including the conductive terminal and applying a mold compound to the plurality of semiconductor dies.

19. A method of manufacturing a semiconductor package, comprising:
    applying a tape to an unsingulated semiconductor package array that are molded using a mold compound;
    aligning the unsingulated semiconductor package array with a saw tool;
    using a first saw blade to form a kerf in a bottom surface of the unsingulated semiconductor package array, the bottom surface including a plurality of conductive terminals, the kerf extending to a first thickness of the unsingulated semiconductor package array between two individual, adjacent, unsingulated semiconductor packages;

removing debris from the kerf;

aligning the saw tool with the kerf; and using a second saw blade, sawing into the kerf to fully saw through a remaining thickness of the unsingulated semiconductor package array to produce a singulated semiconductor package, a width of the second saw blade narrower than a width of the first saw blade, wherein the first thickness is greater than the remaining thickness.

20. The method of claim 19, further comprising testing a function of the singulated semiconductor package.

21. The method of claim 19, wherein the singulated semiconductor package includes a bottom surface and a side surface orthogonal to the bottom surface, a conductive terminal of the plurality of conductive terminals present on the bottom and side surfaces of the singulated semiconductor package, the side surface of the singulated semiconductor package including a recessed area.

22. The method of claim 21, wherein a step at an interface of the recessed area and a non-recessed area of the side surface of the singulated semiconductor package is substantially flat and is substantially parallel with the bottom surface of the singulated semiconductor package.

23. The method of claim 19, further comprising forming the unsingulated semiconductor package array by wirebonding a plurality of semiconductor dies to the plurality of conductive terminals and applying a mold compound to cover the plurality of semiconductor dies.

\* \* \* \* \*